United States Patent
Kim

(10) Patent No.: US 7,943,481 B1
(45) Date of Patent: May 17, 2011

(54) METHOD OF FORMING FINE PATTERNS

(75) Inventor: Dae Woo Kim, Yongin-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/955,871

(22) Filed: Nov. 29, 2010

(30) Foreign Application Priority Data

Aug. 4, 2010  (KR) .......................... 10-2010-0075253

(51) Int. Cl.
*H01L 21/00* (2006.01)
(52) U.S. Cl. .......................... 438/424; 438/694; 438/696
(58) Field of Classification Search .................. 438/424, 438/694, 696
See application file for complete search history.

(56) References Cited

U.S. PATENT DOCUMENTS

| | | | | |
|---|---|---|---|---|
| 6,063,688 | A * | 5/2000 | Doyle et al. | 438/424 |
| 7,691,543 | B2 * | 4/2010 | Yasuzato | 430/5 |
| 2009/0297988 | A1 * | 12/2009 | Tanaka | 430/319 |
| 2010/0203457 | A1 * | 8/2010 | Hatakeyama | 430/326 |
| 2011/0027993 | A1 * | 2/2011 | Moon et al. | 438/689 |

* cited by examiner

*Primary Examiner* — Jarrett J Stark
*Assistant Examiner* — Nicholas Tobergte
(74) *Attorney, Agent, or Firm* — Marshall, Gerstein & Borun LLP

(57) ABSTRACT

A method of forming fine patterns comprises laminating respective first, second, and third auxiliary layers over an underlying layer, forming first acid diffusion regions spaced apart from each other and each having a first width within the third auxiliary layer, forming second acid diffusion regions spaced apart from each other and each having a second width wider than the first width within the second auxiliary layer, and forming third acid diffusion regions spaced apart from each other and each having a third width narrower than the first width within the first auxiliary layer, forming first auxiliary patterns separated from each other at an interval of the third width, forming second auxiliary patterns on respective first auxiliary patterns and separated from each other at an interval of the second width, and forming third auxiliary patterns on respective second auxiliary patterns and separated from each other at an interval of the first width by removing the first to third acid diffusion regions, respectively, forming a first hard mask pattern between the first auxiliary patterns and forming a second hard mask pattern on sidewalls of each of the second auxiliary patterns under respective third auxiliary patterns, removing the third auxiliary patterns to expose the second auxiliary patterns, removing the second auxiliary patterns and some of the first auxiliary patterns exposed between the first and second hard mask patterns, and removing some of the first auxiliary patterns exposed by the removal of the second auxiliary patterns.

16 Claims, 2 Drawing Sheets

METHOD OF FORMING FINE PATTERNS

CROSS-REFERENCE TO RELATED APPLICATION

Priority to Korean patent application number 10-2010-0075253 filed on Aug. 4, 2010, the entire disclosure of which is incorporated by reference herein, is claimed.

BACKGROUND

An exemplary embodiment relates generally to a method of forming the patterns of a semiconductor device and, more particularly, to a method of forming a pattern that is finer than the exposure resolution limit.

The patterns of a semiconductor device are typically formed using a photolithography process. The photolithography process includes a process of depositing a photoresist layer on an underlying layer for target patterns, a process of exposing the photoresist layer, and a process of developing the exposed photoresist layer. A photoresist pattern is thus formed on the underlying layer through the photolithography process.

The photoresist pattern is used as an etch mask when patterning the patterns of the semiconductor device. Accordingly, the size of the photoresist pattern serves as a factor in determining the size of patterns of the semiconductor device.

The size of the photoresist pattern is determined by the exposure resolution. For this reason, there is a limit to the fineness of the photoresist pattern due to the exposure resolution limit. Consequently, there is a limit to the fineness of patterns of the semiconductor device. For the purpose of highly integrating semiconductor devices, however, there is a need for a scheme for forming a pattern that is finer than the exposure resolution limit.

BRIEF SUMMARY

An exemplary embodiment relates to a method of forming a finer pattern than the exposure resolution limit.

A method of forming fine patterns according to an aspect of the disclosure comprises: laminating respective first, second, and third auxiliary layers over an underlying layer; forming first acid diffusion regions spaced apart from each other and each having a first width within the third auxiliary layer, forming second acid diffusion regions spaced apart from each other and each having a second width wider than the first width within the second auxiliary layer, and forming third acid diffusion regions spaced apart from each other and each having a third width narrower than the first width within the first auxiliary layer; forming first auxiliary patterns separated from each other at an interval of the third width, forming second auxiliary patterns on respective first auxiliary patterns and separated from each other at an interval of the second width, and forming third auxiliary patterns on respective second auxiliary patterns and separated from each other at an interval of the first width by removing the first to third acid diffusion regions, respectively; forming a first hard mask pattern between the first auxiliary patterns and forming a second hard mask pattern on sidewalls of each of the second auxiliary patterns under respective third auxiliary patterns; removing the third auxiliary patterns to expose the second auxiliary patterns; removing the second auxiliary patterns and some of the first auxiliary patterns exposed between the first and second hard mask patterns; and, removing some of the first auxiliary patterns exposed by the removal of the second auxiliary patterns.

The first to third acid diffusion regions preferably are formed by generating acid within the third to first auxiliary layers, respectively, by an exposure process and diffusing the acid by a baking process.

The first and second hard mask patterns preferably are formed by filling a hard mask layer between the first auxiliary patterns and between the second auxiliary patterns and etching exposed regions of the hard mask layer using the third auxiliary patterns as an etch mask to expose some of a top surface of the first auxiliary patterns.

The method preferably further comprises etching the underlying layer using the first and second hard mask patterns as an etch mask, after removing some of the first auxiliary patterns exposed by the removal of the second auxiliary patterns.

The first auxiliary layer preferably is made of a mixture comprising at least one of a thermal acid generator (TAG) and a photo acid generator (PAG), a light-absorbing resin, and a cross-linked polymer. The cross-linked polymer preferably is de-cross-linked by acid, such that the de-cross-linked polymer is soluble to a developer for removing the first to third acid diffusion regions.

The second auxiliary layer preferably is made of a mixture comprising at least one of a thermal acid generator (TAG) and a photo acid generator (PAG), a light-transmitting resin, and a cross-linked polymer. The cross-linked polymer preferably is de-cross-linked by acid, such that the de-cross-linked polymer is soluble to a developer for removing the first to third acid diffusion regions. The third auxiliary layer preferably comprises a photoresist.

An additive for activating a diffusion of acid preferably is mixed in the first to third auxiliary layers. The additive content preferably is higher in the second auxiliary layer than in the third auxiliary layer and lower in the first auxiliary layer than in the third auxiliary layer.

Each of the first hard mask patterns preferably has the same width as each of the second hard mask patterns. Each of the third auxiliary patterns preferably protrudes on both sides of the second auxiliary pattern by the third width. Each of the second auxiliary patterns preferably has the third width. Each of the first auxiliary patterns preferably protrudes on both sides of the third auxiliary pattern by the third width.

The hard mask layer preferably is made of a material having a different etch rate from a material of the first to third auxiliary layers. The hard mask layer preferably is made of a carbon-containing mixture.

DESCRIPTION OF EMBODIMENT

Figure 1A:
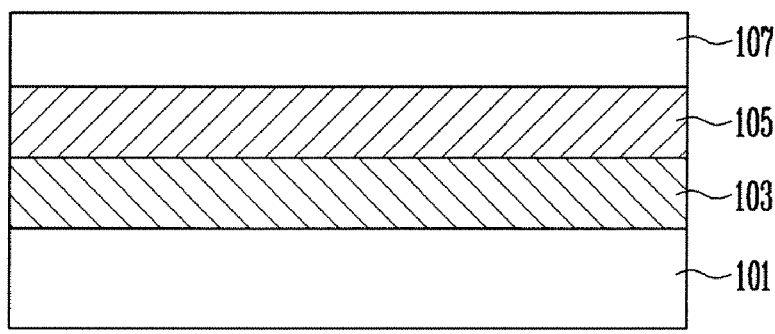
FIGS. 1A to 1G are cross-sectional views illustrating a method of forming fine patterns according to an exemplary embodiment of the disclosure.

Hereinafter, an exemplary embodiment of the disclosure are described in detail below with reference to the accompanying drawings. The drawing figures are provided to allow those having ordinary skill in the art to understand the scope of the embodiment of the disclosure.

FIGS. 1A to 1G are cross-sectional views illustrating a method of forming fine patterns according to an exemplary embodiment of the disclosure.

Referring to FIG. 1A, first to third auxiliary layers 103, 105, and 107 are laminated over an underlying layer 101 for target patterns.

The underlying layer 101 preferably is one of a semiconductor substrate, an insulating layer formed on a semiconductor substrate, a conductive layer formed on a semiconductor substrate, or an auxiliary hard mask layer formed on an insulating layer or a conductive layer.

Each of the first to third auxiliary layers 103, 105, and 107 is preferably made of a material containing a photo acid generator (PAG), which can generate acid by light. Furthermore, each of the first to third auxiliary layers 103, 105, and 107 preferably is made of a material so that exposed regions where acid has been generated from the first to third auxiliary layers 103, 105, and 107 can be removed by a development process. Furthermore, the second and third auxiliary layers 105, 107 preferably are made of a material that can transmit a light source such that light radiated from an upper side of the first auxiliary layer 103 is transmitted to the first auxiliary layer 103 via the second and third auxiliary layers 105, 107.

It is also preferred that in a development process, the second auxiliary layer 107 has a higher solubility for a developer than the first and third auxiliary layers 103, 107, and that the first auxiliary layer 103 has a lower solubility for a developer than the third auxiliary layer 107. To this end, an additive for activating the diffusion of acid may be mixed in the first to third auxiliary layers 103, 105, and 107. It is preferred that the second auxiliary layer 105 have a higher additive content than the third auxiliary layer 107, and that the first auxiliary layer 103 has a lower additive content than the third auxiliary layer 107. Accordingly, the diffusion rate of acid resulting from heat or light is higher in the second auxiliary layer 105 than in the third auxiliary layer 107 and lower in the first auxiliary layer 103 than in the third auxiliary layer 107.

For example, the third auxiliary layer 107 may be made of a photoresist. The photoresist preferably is formed of a mixture containing a light-transmitting resin, a photo acid generator (PAG), and a thermal acid generator (TAG). Furthermore, the second auxiliary layer 105 preferably is made of a mixture containing at least one of a photo acid generator (PAG) and a thermal acid generator (TAG), a light-transmitting resin, and cross-linked polymer that has been de-cross-linked by acid and thus soluble in a developer-soluble. Furthermore, the first auxiliary layer 103 preferably is formed of a developer-soluble bottom anti-reflective coating (D-BARC) layer. The D-BARC layer preferably is made of a mixture containing at least one of a photo acid generator (PAG) and a thermal acid generator (TAG), a light-absorbing resin, and a cross-linked polymer that has been de-cross-linked by acid and thus soluble in a developer.

Figure 1B:
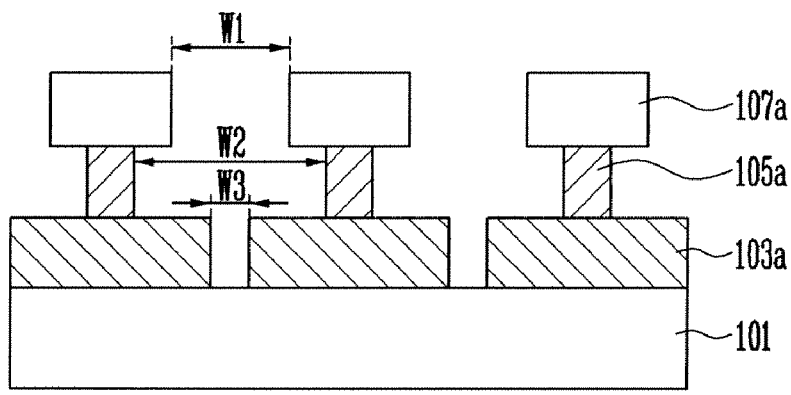

Referring to FIG. 1B, first acid diffusion regions, spaced apart from each other and each having a first width W1, are formed within the third auxiliary layer 107. Second acid diffusion regions, spaced apart from each other and each having a second width W2 that is wider than the first width W1, are formed the second auxiliary layer 105. Third acid diffusion regions, spaced apart from each other and each having a third width W3 narrower than the first width W1, are formed within the first auxiliary layer 103. First auxiliary patterns 103a spaced apart from each other at the third width W3, second auxiliary patterns 105a formed on the first auxiliary patterns 103a, respectively, and spaced apart from each other at the second width W2, and third auxiliary patterns 107a formed on the second auxiliary patterns 105a, respectively, and spaced apart from each other at the first width W1 are formed by removing the first to third acid diffusion regions.

The first to third acid diffusion regions preferably are formed by performing an exposure process for generating acid in selected regions within the first to third auxiliary layers and then performing a post exposure bake (PEB) process for diffusing the acid generated in the exposure regions of the first to third auxiliary layers.

In the exposure process, selected regions of the first to third auxiliary layers are exposed to light passing through a reticle (not shown) of an exposure apparatus. The reticle includes light-shield patterns formed on a transparent substrate. The light-shield patterns function to limit the exposure regions of the first to third auxiliary layers. Here, it is preferred that the width of the light-shield pattern formed in the reticle be greater than the width of the pattern of a semiconductor device to be formed. Meanwhile, in order to form fine patterns, an exposure apparatus for immersion, having a light source of ArF 193 nm, for example, may be used in the exposure process.

The diffusion of acid by the post exposure bake (PEB) process is faster in the second auxiliary layer than in the third auxiliary layer, but slower in the first auxiliary layer than in the third auxiliary layer because of a difference in the content of the additive mixed in the first to third auxiliary layers. Accordingly, the first acid diffusion region formed within the third auxiliary layer has the first width W1, the second acid diffusion region formed within the second auxiliary layer has the second width W2 wider than the first width W1, and the third acid diffusion region formed within the first auxiliary layer has the third width W3 narrower than the first width W1. A de-cross-linking reaction is generated in the first to third acid diffusion regions because of acid, and the first to third acid diffusion regions become soluble in developer.

Next, the first to third acid diffusion regions are removed by a development process using a developer, such as tetra-methyl-ammonium hydroxide (TMAH). Accordingly, the first to third auxiliary patterns 103a, 105a, and 107a are formed.

Both sides of each of the third auxiliary patterns 107a protrude farther than both sides of each of the second auxiliary pattern 105a, and both sides of each of the first auxiliary patterns 103a protrude farther than both sides of each of the third auxiliary pattern 107a. Accordingly, the edges of portions from which the second acid diffusion region has been removed are protected by the third auxiliary pattern 107a.

The respective width and interval of each of the first to third auxiliary patterns 103a, 105a, and 107a can be controlled by adjusting the additive content for controlling the diffusion of acid. For example, to equally form the width and interval of first and second hard mask patterns to be formed subsequently, each of the second auxiliary patterns 105a preferably is formed to have the third width W3 by controlling the additive content. Furthermore, both sides of the third auxiliary pattern 107a preferably are formed so that they protrude farther than both sides of the second auxiliary pattern 105a by the third width W3. Furthermore, both sides of the first auxiliary pattern 103a preferably are formed so that they protrude farther than both sides of the third auxiliary pattern 107a by the third width W3.

Figure 1C:
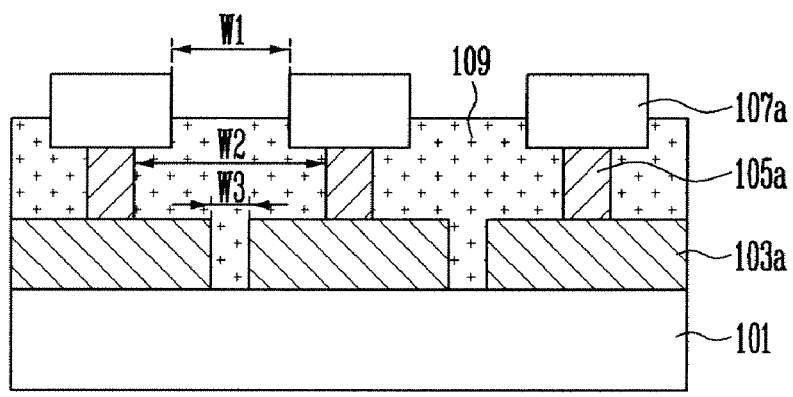

Referring to FIG. 1C, a multi-function hard mask (MFHM) layer (hereinafter referred to as a 'hard mask layer') 109 is filled between the second auxiliary patterns 107a and between the first auxiliary patterns 103a. Here, the hard mask layer 109 preferably is formed up to the height of the third auxiliary patterns 107a so that the hard mask layer 109 can fully fill the spaces between the second auxiliary patterns 107a and between the first auxiliary patterns 103a.

A material used as the hard mask layer 109 preferably is selected according to the thickness and type of the underlying layer 101. It is also preferred that the hard mask layer 109 be made of a material having a relatively high etch selectivity for the first to third auxiliary layers. Thus, the hard mask layer 109 preferably is made of a material having a higher etch rate relative to the respective etch rates of the first to third auxiliary layers. Furthermore, the hard mask layer 109 preferably is made of a material that is fluidic and that can be coated. A mixture containing carbon preferably is used as a material of the hard mask layer 109.

Figure 1D:
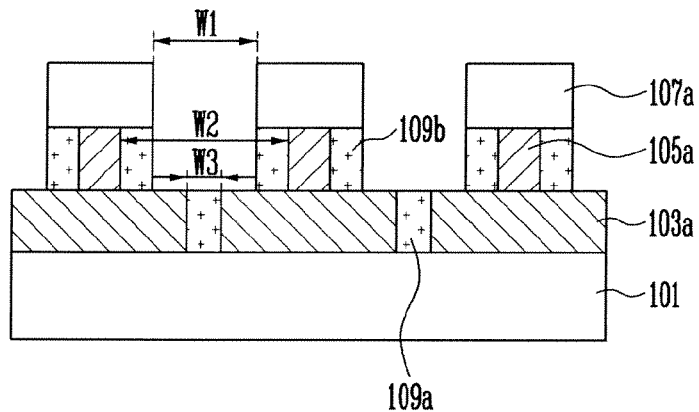

Referring to FIG. 1D, the hard mask layer is removed to a selected height by an etch-back process using the third auxiliary patterns 107a as an etch mask to expose a selected region of a top surface of the first auxiliary patterns 103a that does not overlap with the third auxiliary patterns 107a. Accordingly, the hard mask layer remains as first hard mask patterns 109a each between the first auxiliary patterns 103a and also as second hard mask patterns 109b on the sidewalls of the second auxiliary patterns 105a under the third auxiliary patterns 107a. The width of each of the first and second hard mask patterns 109a, 190b can become narrower than the exposure resolution limit because it is determined by a difference in the degree of diffusion.

Figure 1E:
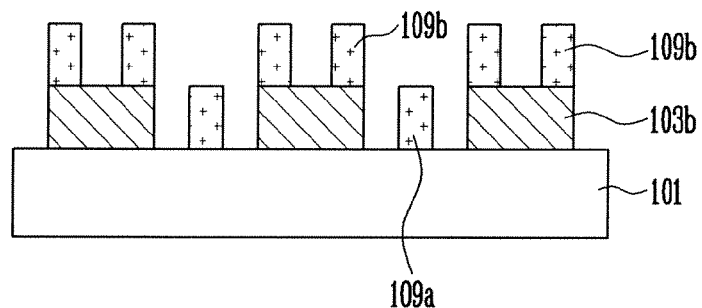

Referring to FIG. 1E, the third auxiliary patterns are removed, and the second auxiliary patterns and the exposed regions of the first auxiliary patterns are removed, thereby forming fourth auxiliary patterns 103b.

A method of forming the fourth auxiliary patterns 103b is described below in detail. First, the third auxiliary patterns are removed to expose the second auxiliary patterns. The exposed second auxiliary patterns, and some of the first auxiliary patterns exposed between the first and second hard mask patterns 109a, 109b are removed to expose the underlying layer 101. After selected regions of the first auxiliary patterns exposed between the first and second hard mask patterns 109a, 109b are removed, the first auxiliary layer remains as the fourth auxiliary patterns 103b.

Figure 1F:
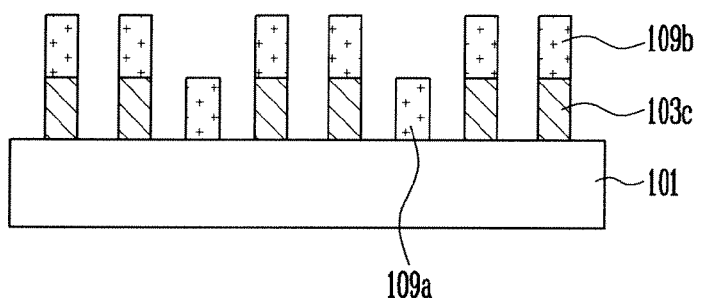

Referring to FIG. 1F, fifth auxiliary patterns 103c are formed by removing the fourth auxiliary patterns which are exposed between the second hard mask patterns 109b because of the removal of the second auxiliary patterns. Accordingly, the underlying layer 101 is covered or exposed by the first and second hard mask patterns 109a, 109b having a width and interval narrower than the exposure resolution limit.

Figure 1G:
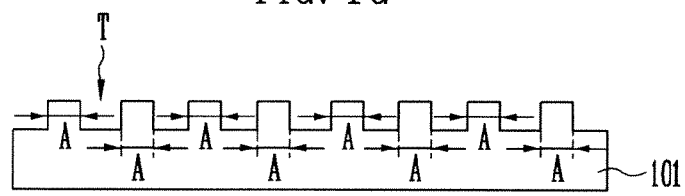

Referring to FIG. 1G, the underlying layer 101 is etched using the first and second hard mask patterns, described with reference to FIG. 1F, as an etch mask. In case where the underlying layer 101 is a semiconductor substrate, trenches T for isolation, each having a width narrower than the exposure resolution limit, may be formed in the regions from which the underlying layer 101 has been removed, and an active region A narrower than the exposure resolution limit may be defined between the trenches T. This disclosure is not limited to a case where the underlying layer 101 is a semiconductor substrate, but may be applied to a case where the underlying layer 101 is a conductive layer, an insulating layer, or an auxiliary hard mask layer.

As described above, according to the disclosure, the width and interval of the first and second hard mask patterns can be narrower than the exposure resolution limit by using a difference in the diffusion rate of acid in the first to third auxiliary layers. If the method of forming fine patterns according to the disclosure is used, a fine pattern of 10 nm level can be formed.

Meanwhile, when forming a hard mask pattern narrower than the exposure resolution limit, a spacer formation process may be used. A method of forming the hard mask patterns using spacers is described in detail below. First, the spacers are formed on the sidewalls of auxiliary patterns formed using a photoresist pattern. The spacers preferably are formed by depositing a spacer layer using an oxide layer or a nitride layer along a step defined by the auxiliary patterns so that space between the auxiliary patterns is not filled, and then performing an etch process, such as an etch-back process. In this case, a problem arises in that a step coverage characteristic must be taken into consideration in the process of depositing the spacer layer. Furthermore, an inclination may be generated in the spacer layer formed at the edge portion of the step, and so a top surface of the spacers may be inclined. If a patterning process is performed using the spacers, there is a problem in that the patterns formed using the spacers have an asymmetrical structure.

Meanwhile, in the disclosure, the widths and intervals of the first to third auxiliary patterns can be quantitatively adjusted by quantitatively controlling a difference in the diffusion rate of acid in the first to third auxiliary layers. Accordingly, the disclosure can be used to uniformly form the widths and intervals of the first and second hard mask patterns defined by the widths and intervals of the first to third auxiliary patterns. Furthermore, in the disclosure, since spaces between the second auxiliary patterns and spaces between third auxiliary patterns are filled with the fluidic hard mask layer, the step coverage problem need not to be taken into consideration. Furthermore, in the disclosure, since the hard mask layer is not formed by using spacers, the asymmetrical pattern problem occurring because of the inclination at the top surface of the spacers can be improved.

According to the disclosure, the acid diffusion regions with different widths are formed within the first to third auxiliary layers sequentially laminated. Next, the first auxiliary patterns separated from each other, the second auxiliary patterns formed on the first auxiliary patterns, respectively, and separated from each other at a width wider than that of the first auxiliary patterns, and the third auxiliary patterns formed on the second auxiliary patterns, respectively, and separated from each other at a width narrower than that of the second auxiliary patterns are formed by removing the acid diffusion regions. Next, each of the first hard mask patterns is formed between the first auxiliary patterns, and the second hard mask patterns are formed on the sidewalls of the second auxiliary patterns under the third auxiliary patterns.

According to the disclosure, since the first and second hard mask patterns are formed by using the above method, the widths and intervals of the first and second hard mask patterns can be defined by controlling the widths of the acid diffusion regions within the first to third auxiliary layers. Accordingly, each of the widths and intervals of the first and second hard mask patterns can be narrower than the exposure resolution limit.

Furthermore, according to the disclosure, the patterns of a semiconductor device are patterned by using the first and second hard mask patterns, finely formed by overcoming the exposure resolution limit, as an etch mask. Accordingly, the width of each of the patterns of a semiconductor device can be narrower than the exposure resolution limit.

What is claimed is:

1. A method of forming fine patterns, comprising:
   laminating respective first, second, and third auxiliary layers over an underlying layer;
   forming first acid diffusion regions spaced apart from each other and each having a first width within the third auxiliary layer, forming second acid diffusion regions spaced apart from each other and each having a second width wider than the first width within the second auxiliary layer, and forming third acid diffusion regions spaced apart from each other and each having a third width narrower than the first width within the first auxiliary layer;

forming first auxiliary patterns separated from each other at an interval of the third width, forming second auxiliary patterns on respective first auxiliary patterns and separated from each other at an interval of the second width, and forming third auxiliary patterns on respective second auxiliary patterns and separated from each other at an interval of the first width by removing the first to third acid diffusion regions, respectively;

forming a first hard mask pattern between the first auxiliary patterns and forming a second hard mask pattern on sidewalls of each of the second auxiliary patterns under respective third auxiliary patterns;

removing the third auxiliary patterns to expose the second auxiliary patterns;

removing the second auxiliary patterns and some of the first auxiliary patterns exposed between the first and second hard mask patterns; and removing some of the first auxiliary patterns exposed by the removal of the second auxiliary patterns.

2. The method of claim 1, comprising forming the first, second, and third acid diffusion regions by generating acid within the third, second, and first auxiliary layers, respectively, by an exposure process and diffusing the acid by a baking process.

3. The method of claim 1, comprising forming the first and second hard mask patterns by filling a hard mask layer between the first auxiliary patterns and between the second auxiliary patterns and etching exposed regions of the hard mask layer using the third auxiliary patterns as an etch mask to expose some of a top surface of the first auxiliary patterns.

4. The method of claim 1, further comprising etching the underlying layer using the first and second hard mask patterns as an etch mask, after removing some of the first auxiliary patterns exposed by the removal of the second auxiliary patterns.

5. The method of claim 1, wherein the first auxiliary layer comprises a mixture of at least one of a thermal acid generator (TAG) and a photo acid generator (PAG), a light-absorbing resin, and a cross-linked polymer.

6. The method of claim 5, comprising de-cross-linking the cross-linked polymer by acid such that the de-cross-linked polymer is soluble to a developer for removing the first to third acid diffusion regions.

7. The method of claim 1, wherein the second auxiliary layer comprises a mixture of at least one of a thermal acid generator (TAG) and a photo acid generator (PAG), a light-transmitting resin, and a cross-linked polymer.

8. The method of claim 7, comprising de-cross-linking the cross-linked polymer by acid such that the de-cross-linked polymer is soluble to a developer for removing the first to third acid diffusion regions.

9. The method of claim 1, wherein the third auxiliary layer comprises a photoresist.

10. The method of claim 1, comprising:
mixing an additive for activating a diffusion of acid in the first to third auxiliary layers, wherein the content of the additive is higher in the second auxiliary layer than in the third auxiliary layer and lower in the first auxiliary layer than in the third auxiliary layer.

11. The method of claim 1, wherein each of the first hard mask patterns has an identical width as each of the second hard mask patterns.

12. The method of claim 1, wherein each of the third auxiliary patterns protrudes on both sides of the second auxiliary pattern by the third width.

13. The method of claim 1, wherein each of the second auxiliary patterns has the third width.

14. The method of claim 1, wherein each of the first auxiliary patterns protrudes on both sides of the third auxiliary pattern by the third width.

15. The method of claim 1, wherein the hard mask layer comprises a material having a different etch rate from a material of the first to third auxiliary layers.

16. The method of claim 15, wherein the hard mask layer comprises a carbon-containing mixture.

* * * * *